United States Patent
van den Brand et al.

(10) Patent No.: US 8,415,246 B2
(45) Date of Patent: Apr. 9, 2013

(54) METHOD OF FORMING A HIGH DENSITY STRUCTURE

(75) Inventors: Jeroen van den Brand, Goirle (NL); Andreas Heinrich Dietzel, Kempen (DE)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 0 days.

(21) Appl. No.: 13/054,277

(22) PCT Filed: Jul. 14, 2009

(86) PCT No.: PCT/NL2009/050430
§ 371 (c)(1),
(2), (4) Date: Mar. 15, 2011

(87) PCT Pub. No.: WO2010/008281
PCT Pub. Date: Jan. 21, 2010

(65) Prior Publication Data
US 2011/0159683 A1 Jun. 30, 2011

(30) Foreign Application Priority Data
Jul. 15, 2008 (EP) .................................. 08160452

(51) Int. Cl.
*H01L 21/768* (2006.01)

(52) U.S. Cl. ................................ 438/618; 257/E21.575
(58) Field of Classification Search .................. 438/618; 257/E21.575
See application file for complete search history.

(56) References Cited

U.S. PATENT DOCUMENTS

| 3,948,706 A | 4/1976 | Schmeckenbecher |
| 3,956,052 A | 5/1976 | Koste et al. |
| 4,080,513 A * | 3/1978 | Cuneo et al. .................. 174/255 |
| 4,985,601 A * | 1/1991 | Hagner ......................... 174/261 |
| 5,460,921 A * | 10/1995 | Cywar et al. .................. 430/314 |
| 5,789,121 A | 8/1998 | Cywar et al. |
| 7,014,727 B2 | 3/2006 | Wargo et al. |

* cited by examiner

*Primary Examiner* — Calvin Lee
*Assistant Examiner* — Monica D Harrison
(74) *Attorney, Agent, or Firm* — Novak Druce Connolly Bove + Quigg LLP

(57) ABSTRACT

A method of forming a high density structure may include the steps of providing a substrate wherein the high density structure is to be formed with a release liner, the release liner being self-removable; forming at least one cavity in the substrate through the release liner, the at least one cavity forming at least a part of the high density structure; at least partially filling the at least one cavity with a filler material; sintering the thus formed structure; and removing the release liner from the substrate.

17 Claims, 3 Drawing Sheets

METHOD OF FORMING A HIGH DENSITY STRUCTURE

CROSS-REFERENCE TO RELATED APPLICATIONS

This application is filed under 35 U.S.C. 371 as a U.S. national phase application of PCT /NL2009/050430, having an international filing date of 14 Jul. 2009, which claims the benefit of European Patent Application No. 08160452.2, having a filing date of 15 Jul. 2008, both of which are hereby incorporated by reference.

FIELD OF THE INVENTION

The invention relates to a method of forming a high density structure. In particular, the invention relates to a method of forming a high density electrical circuit.

BACKGROUND OF THE INVENTION

An embodiment of a method of forming a high density structure is known from U.S. Pat. No. 7,014,727. The known method is arranged to form a suitable pattern of an electric circuit partially in a volume of a substrate and partially on a surface of the substrate and comprises the steps of: laminating the substrate with a dielectric material in which at least some structures of the electrical circuit are to be formed; milling the substrate and the dielectric material for forming suitable cavities, filling the thus formed cavities in the substrate and in the dielectric material with an electrically conductive substance. In the known method, the dielectric layer is conceived to substantially match a surface area of the substrate. In order to remove the dielectric layer from the surface of the substrate the known method comprises supplementary steps of laminating a further layer on top of the semiconductor layer, baking the thus provided structure for enabling due adherence between the dielectric layer and the further layer. Removing the further layer together with the dielectric layer for forming an electrical circuit partially embedded in the substrate and partially arranged on a surface of the substrate, said electrical circuit being composed only of the electrically conductive material and the substrate material.

The known method has a number of disadvantages. First, it comprises a number of processing steps unnecessary complicating manufacturing process. For example, a releasable dielectric material is provided for forming structures on the surface of the substrate, which can only be removed by application of a further layer. In addition, in the known method the further layer has to be adhered to an outer surface of the dielectric layer during a baking step. As a result, residuals of the semiconductor layer may be left behind when surface adherence between the dielectric layer and the substrate is stronger than surface adherence between the dielectric layer and the further layer.

SUMMARY OF THE INVENTION

It may be desirable to provide a low cost method of forming a high density structure, wherein such structure has improved properties.

To this end the method according to the invention comprises the steps of:
providing a substrate wherein the high density structure is to be formed with a release liner, said release liner being self-removable;
forming at least one cavity in the substrate through the release liner, said at least one cavity forming at least a part of the high density structure;
at least partially filling the at least one cavity with a filler material;
sintering the thus formed structure;
removing the release liner from the substrate after the step of sintering.

According to the method of the invention, the high density structure is provided in a volume of the substrate which enables manufacturing of thicker structures. This is advantageous in case the method is used for manufacturing a high density electrical circuit, as thicker conductive lines will result in increased conductivity thereof.

It is one of the advantages of the method according to the invention that low cost materials may be used. However, suitable low cost materials cannot be sintered at high temperatures. Such materials are usually sintered at temperatures in the range of 100 to 150° C. It is found that pastes, for example Dupont 5025 Ag-filled screen printing paste, Inktec PA series nano-Ag-filled screen printing pastes, may shrink up to 60%-80% of their initial volume post sintering. It will be appreciated, however, that those skilled in the art have knowledge on which other low cost pastes may be suitable for use in the method of the invention.

Advantageously, to mitigate shrinkage phenomenon, the release liner should be thick enough, preferably, thickness of the release liner in about 5-70 μm.

Accordingly, after removal of the release liner post sintering the filling will be present substantially inside the cavities, or it may be flush with the substrate surface, i.e. no filling will be protruding outside the cavities. Due to this fact, if required, a second release liner may be provided for creating one or more further cavities for accommodating a further material.

The cavities may be formed in the substrate, for example, by means of any of the following processes: photoablating, embossing or mechanical milling. It will be appreciated that in the former case for the release liner a material should be selected which is laser ablatable. For example, examples of a suitable release liner relate to PVA, PET, wherein PET release liner may be provided with a thin layer of a suitable adhesive. Alternatively, a PET film may be used, which can be arranged on the substrate electrostatically. Examples of a suitable filler material relate to Cu, Ag or C-comprising pasta's.

By depositing a release liner on a surface of the substrate prior to any substantial processing step, like cavity forming and cavity filling, the overall surface of the substrate is protected from deposition of undesirable material, like debris or contamination from the filler material. This improves operational properties of the high density structure, in particular of a high density electrical circuit.

An embodiment of a method for forming conductive lines in a ceramic substrate is known from U.S. Pat. No. 3,956,052. In the known method the release liner is removed from the substrate prior to the step of sintering. This is necessary because ceramics should be sintered at substantially elevated temperatures, like above 350° C. As a result the release liner would carry some protruding filler material, which will be removed prior to sintering.

A disadvantage of the known method is that it not suitable for use with materials having low sintering temperature.

Document U.S. Pat. No. 5,798,121 describes a method for manufacturing electrically conductive lines on a surface of a substrate. The known method comprises a step of laminating two substrates having a conducting layer there between, wherein one of the substrates is provided with a coating layer.

Conductive lines provided on a surface of the substrates may be connecting by boring transverse vias through the substrates.

It is a disadvantage of the known method that conductive lines are initially provided on a surface of a substrate which necessitates a step of assembling such substrates for providing a structure having internal conductive lines.

A further advantage of the method according to the invention relates to the fact that this method represents an additive process, wherein substantially no material is lost. For example, no deposition of a dielectric layer is necessary for forming structures on a surface of the substrate. The release liner is self-removable, which may relate to an easy detachable release liner or to a soluble release liner. It is found to be advantageous to provide a soluble release liner which may easily be disengaged from the substrate without damaging integrity of the produced high density circuit. Preferably, a water soluble release liner is provided, for example based on poly vinyl alcohol, as water is an environment friendly substance and is chemical inert. It will be appreciated that the term 'self-releasable' relates merely to the fact that no additional adhering layers have to be applied to the release liner for removal thereof from the surface of the substrate on one hand, and that the layer may be soluble, on the other hand.

Preferably, the release liner is spin coated or laminated on the surface of the substrate. In another embodiment the release liner may be coated in a roll-to-roll process using, for example, slot die coating. The spin-coating may have an advantage that a required and substantially homogeneous adhesion of the release liner to the substrate is enabled.

Next, in the method according to the invention low cost materials, for example screen printing pastes may be used, which may be deposited using existing screen/stencil printing technology, which may ensure cost efficiency of the method according to the invention.

In an embodiment of a method according to the invention the method an outer surface of a structure provided by the filler material in the at least one cavity is substantially flush with an outer surface of the substrate.

Another advantage of the method according to the invention resides on the fact that due to the fact that the cavities are provided in the volume of the substrate and not on its surface, resulting in a substantially flush outer surface. This feature makes it possible to repeat deposition of the release layer as many times as required for providing as many additional cavities as is desirable. It will be appreciated that due to the fact that a suitable number of cavities may be provided during different processing steps, these cavities may be used for embedding different functional sub-structures of the high density structure and may, therefore, comprise different filler materials. For example, it is possible to create a suitable set of electrically conductive lines and then to create a suitable number of cavities filled with electrically resistive material for creating integrated resistances. Another embodiment may relate to different optical structures or to a combination of an electric structure with an optical waveguide or a fluidic structure, for example for MEMS applications. It will be appreciated that in this embodiment it is not necessary to use a self-removable release liner, although such release liner may be advantageous for the above reasons.

In an embodiment of the method according to the invention, multi-material processing may be provided by the following steps:

providing a second release liner on the surface of the substrate;

forming at least one further cavity in the substrate through the second release liner, said at least one further cavity forming a further part of the high density structure, at least partially filling the at least one further cavity with a further filler material.

It will be appreciated that the further release liner is applied after structures of a first filler material are formed in the substrate and after removal of the initial release liner. It will be further appreciated that such steps may be repeated as many times as may be necessary for forming multi-material high density structure.

In a further embodiment of the method according to the invention for the step of at least partially filling the cavity with the filler material and/or for the step of at least partially filling the further cavity with the further filler material squeegee processing is used.

Squeegee processing may be preferable for enabling fast and reliable filling of the cavities provided in the substrate. Another possibility of cavity filling may relate to a processing using dispenser which represents a suitable low cost alternative. It will be appreciated that due to the fact that the release liner according to the invention is provided on the surface of the substrate prior to the filling step, no particular accuracy condition is put to the step of squeegee filling or dispensing, as any excessive material left will be removed together with the release liner, because it extends substantially over the whole surface area of the substrate.

In a further embodiment of the method according to the invention during the step of at least partially filling the filler material and/or the further filler material are provided in excess for excessively filling the at least one cavity and/or the at least one further cavity.

This technical measure of based on the insight that the filler material usually has a tendency to shrink post deposition. In order to account for said shrinkage, the filler material may be provided in excess thereby substantially fully filling the at least one cavity in the substrate. This feature leads to a further improvement of operational properties of the high density structure. Alternatively, it is possible to repeat a filling step after the filler material has shrunk.

In a still further embodiment of the method according to the invention a line width of the high density structure is in the order of 50 micrometer.

It is found that the method according to the invention enables a low cost manufacturing of high density structures having a substantially decreased line width which increases pattern density of the structure.

In a still further embodiment of the method according to the invention height of the at least one cavity and/or of the at least one further cavity is in the range of 20%-70% of the substrate's thickness, preferably in the range of 20%-90% of the substrate's thickness.

It is found to be advantageously to utilize substantially the whole thickness of the substrate for embedding suitable elements of the high density structures. In particular, for electric circuitry an increased line thickness may substantially increase conductivity of the lines, which is advantageous.

In a still further embodiment of the method according to the invention, thickness of the release liner is in the range of 1-40 micrometer, more preferably 3-10 micrometer. Such release liners have an advantage of being easily removable from the substrate. In addition, use of thin release lines still further reduces the manufacturing costs.

In a still further embodiment of the method according the invention, the step of at least partially filling the at least one cavity and/or at least partially filling the at least one further cavity comprises:

depositing a seed of a metal in the at least one cavity and/or the at least one further cavity;

electroless growing a metal in the at least one cavity and/or the at least one further cavity.

This embodiment provides an alternative processing step for filling the cavities. It is found that electroless growing of the suitable material piles from seeds deposited in the cavities has an advantage that such material will be present substantially only in the cavities without introducing undesirable contamination elsewhere.

In a still further method according to the invention for the substrate a substrate comprising at least one pre-manufactured cavity is selected, the method comprising the steps of:

providing the release liner in an area of the at least one pre-manufacture cavity for protecting thereof from being filled by the filler material;

embedding a device in the at least one pre-manufactured cavity after removing the release liner.

The release liner as used in the method according to the invention has a further advantage. It is possible to use a substrate with pre-manufactured cavities which can be protected from material interference by the release liner during the step of filling. Such pre-manufactured cavities preferably relate to cavities wherein suitable devices are to be positioned, for example chips.

It will be appreciated that the high density structure may relate to a suitable plurality of items. For example, it may relate an electrical circuit, an optical structure, a fluidic interconnection, a magnetic structure.

These and other features of the invention will be discussed in further detail with reference to the appended Figures, wherein like reference signs represent like elements. It will be appreciated that the Figures are presented for illustrative purposes only and may not be used for limiting the scope of the appended claims.

DETAILED DESCRIPTION OF THE DRAWINGS

Figure 1:
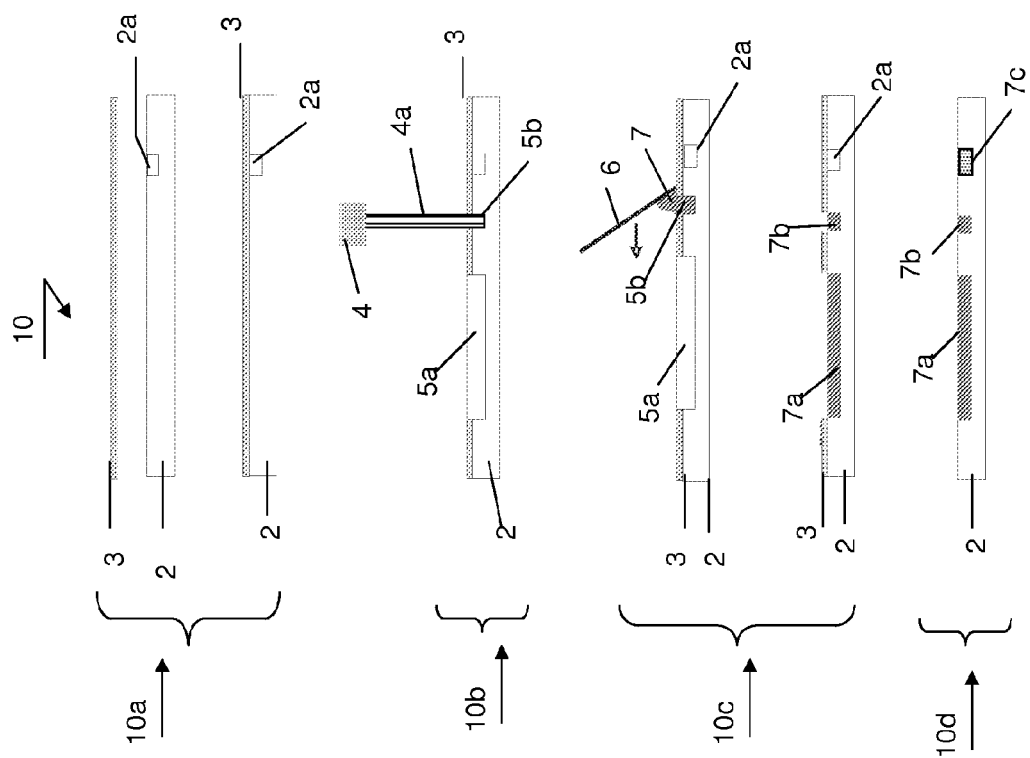
FIG. 1 presents in a schematic way an embodiment of the method according to the invention.

FIG. 1 presents in a schematic way an embodiment of the method according to the invention. The method 10 may comprise steps 10a-10d as will be described herein after. During step 10a a suitable substrate 2 may be selected, said substrate may comprise a piece or a layer of a suitable material, for example a foil. Alternatively, the substrate 2 may comprise a piece or a layer of a suitable material provided with one or more pre-manufactured cavities of the type 2a. It will be appreciated that although the cavity 2a is depicted as a relatively small structure with respect to both a thickness of the substrate and its lateral dimension, the cavity 2a may be of any desirable size and it may have any desirable depth. Preferably, the pre-manufactured cavity 2a is used for housing a suitable device conceived to cooperate with a high density structure provided on the substrate according to the invention.

At step 10a, the substrate 2 is provided with a suitable release liner. The release liner may be suitably deposited, for example using a coating method. Alternatively, the release liner 3 may be laminated on the surface of the substrate conceived to be patterned for purposes of manufacturing the high density structure.

At step 10b, the substrate 2 provided with the release liner 3 is being processed, preferably using an irradiation unit 4 generating a laser beam 4a or providing a suitable number of cavities 5a, 5b in the material of the substrate 2, said cavities being conceived to be filled with a material at least partially forming the high density structure. Preferably, for the laser beam 4a excimer laser is selected. It will be appreciated that the cavities conceived to be provided in the substrate 2 by the laser beam 4a may be interconnected or isolated. Preferably, the irradiation unit 4 is translated with respect to the substrate 2 for patterning thereof. In addition, for purposes of mass production, the cavities may be formed using a suitable laser mask, wherein a broad laser beam is conceived to be swept along a laser mask having a fine pattern. This method has an advantage that a high density structure may be produced faster, compared to a situation when individual features of the high density circuit have to be patterned individually. More preferably, such translation is computer controlled in accordance with a pre-defined patterning scheme. The control program may define not only the cavity's pattern, but also cavity's depths, for example, by means of defining a suitable dwell time of the laser beam 4a on specific areas of the substrate 2. It will be appreciated that cavities may be provided having the same depth or having different depths. Preferably, the cavities have height in the range of 20%-70% of the substrate's thickness, preferably in the range of 20%-90% of the substrate's thickness.

At step 10c the cavities 5a, 5b provided in the substrate 2 at step 10b are filled with a suitable filler material. In case when the high density structure relates to an electrical circuit, the cavities may be filled with an electrically conducting material. By way of example, the cavities 51, 5b may be filled with a suitable filler material using squeegee processing. In this case, a paste 7 is pressed into the cavities 5a, 5b using a suitable squeegee member 6. Preferably, the paste 7 is provided in excess for filling the cavities 5a, 5b for allowing a greater amount of paste to be deposited in the cavities for compensating for paste shrinkage during drying. As a result, the substrate 2 is provided with a suitable number of filled cavities 5a, 5b, whereby a suitable number of pre-manufactured cavities 3a may be left empty. By repeating the steps 10a-10c a suitable number of times a corresponding suitable amount of cavities filled with respective different filler materials may be provided.

At step 10d the release liner 3 is removed from the substrate wherein a high density structure is formed. Subsequently, the substrate 2 together with the high density structure may be dried and/or cured. It is preferable to remove the release liner prior to curing for avoiding undesirable sticking of the release liner 3 to the surface of the substrate 2. The pre-manufactured cavities may be used for housing suitable devices, like chips 7c.

Figure 2:
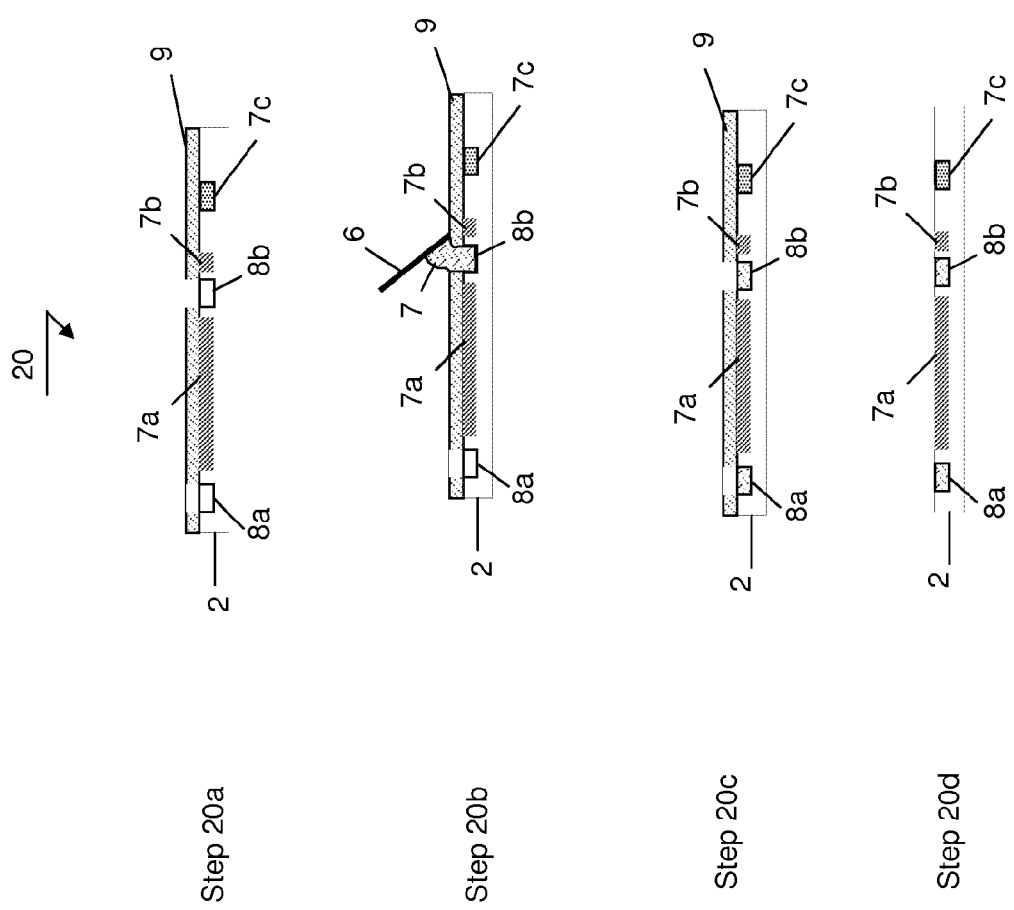
FIG. 2 presents in a schematic way an embodiment of the method according to the invention wherein multi-material patterning is used.

FIG. 2 presents in a schematic way an embodiment of the method according to the invention wherein multi-material patterning is used. The method 20 may comprise the steps 20a, 20b, 20c, 20d. At step 20a a structure provided at step 10d of FIG. 1 may be used. It will be appreciated that the structure may comprise a substrate with at least one pre-manufactured cavity 7c. In accordance with the present embodiment of the method of the invention, at step 20a a further release liner 9 is applied to an outer surface of the substrate 2 followed by a step of providing at least one further cavity 8a, 8b in the substrate 2 through the further release liner 9. Preferably, the further release liner is laser ablatable and the further cavities are provided by means of photoablating using a suitable laser beam (not shown).

At step 20b the further cavities are at least partially filled with the further filler material. It will be appreciated that the further filler material may be either seeded for purposes of electroless growing, or it may be provided using squeegee processing of a suitable paste 7 using an applicator 6. As a result, at step 20c the substrate 2 is provided with a number of cavities being filled with at least two different filler materials. Finally, at step 20d the further release liner 9 is removed from the surface of the substrate 2 either by mechanically detaching thereof or by application of a suitable solvent. It will be further appreciated that the steps 20a-20d may be repeated as many times as is necessary for providing the substrate 2 with a suitable number of cavities having a suitable number of different filler materials. As a result manufacturing of a multi-material high density structure is enabled in a low cost processing method.

Figure 3:
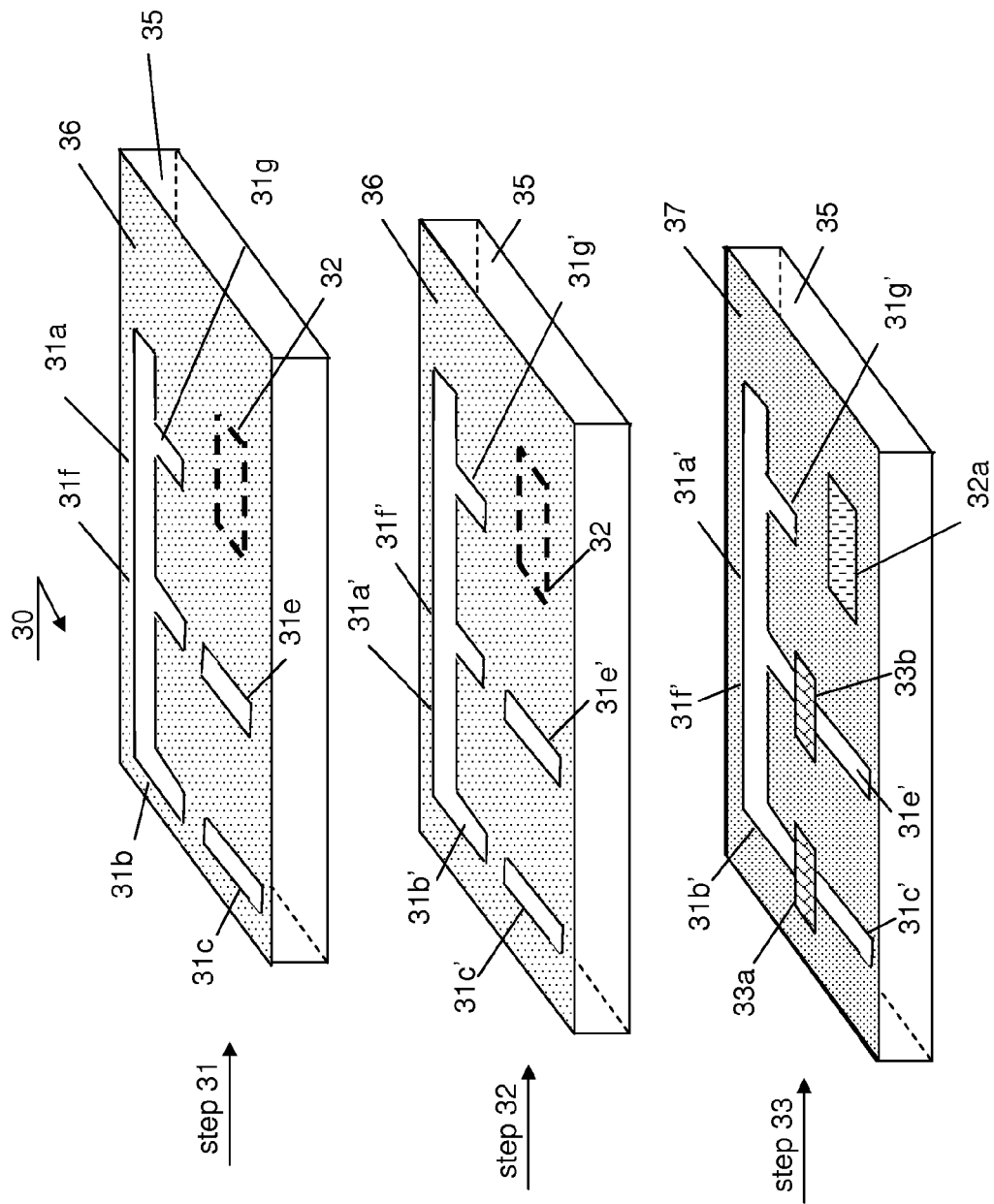
FIG. 3 presents schematically a top view of a substrate processed using a method of FIG. 2.

FIG. 3 presents schematically a top view of a substrate processed using a method of FIG. 2. The method 30 comprises the steps of:
  providing a release liner 36 on an upper surface of the substrate 35;
  providing a suitable set of cavities 31a, 31b, 31c, 31d, 31e, 31f, 31g at least partially constituting a high density structure.

It will be appreciated that for the release liner a suitable plurality of materials may be selected. For example, PET, poly(imide), PEN or PC materials may be used. The substrate 35 may comprise a cavity 32 conceived to house a suitable miniature electronic device, for example a chip. The release liner 36 is preferably self-releasable, that means, that the release liner 36 may be removed from the substrate without applying additional release means, or that it may be dissolved in a suitable solvent.

At step 32, the formed cavities are suitably filled with a filler material, not shown for purposes of figure's readability. The cavities 31a', 31b', 31c', 31d', 31e', 31f', 31g' may be filled with a suitable conductive material, for example a metal, by, first, providing respective seeds in the cavities 31a, 31b, 31c, 31d, 31e, 31f and then by electroless growing the metal in the cavities. Preferably, an upper surface of the resulting filled cavities 31a', 31b', 31c', 31d', 31e', 31f', 31g' is substantially flush with an upper surface of the substrate 35 so that substantially no height profile along the upper surface of the substrate 35 is produced. This has an advantage in that the release liner 36 may be removed and that a further release liner 37 may be provided on the upper surface of the substrate 35. It will be appreciated that the further release liner 37 covers substantially the whole surface area of the substrate 37 so that no material interference between cavities 31a', 31b', 31c', 31d', 31e', 31f', 31g' and 32 and a further material to be used for forming further elements of the high density structure exists.

At step 33 the substrate 35 is provided with a suitable number of further cavities 33a, 33b, which are subsequently filled with a suitable further material. For example, in case when the high density structure relates to an electrical circuit, the cavities 31a', 31b', 31c', 31d', 31e', 31f', 31g' may be filled with a conductive material, for example, metal, while the cavities 33a, 33b may be field with a resistive material. It will be appreciated that the cavities 33a, 33b may be filled with a different material, or may be used to embed a further device in the substrate 35.

Finally, the further release liner 37 is removed and a resulting high-density structure is revealed. It will be appreciated that the step 33 may be performed a suitable number of times, enabling integration of a suitable plurality of different materials in the substrate 35 for forming a multi-material high density structure. As a finishing step, the cavity 32 may be filled with a suitable miniature electronic device.

It will be appreciated that while specific embodiments of the invention have been described above, that the invention may be practiced otherwise than as described. In addition, isolated features discussed with reference to different embodiments may be combined.

What is claimed is:

1. A method of forming a high density structure, comprising the steps of:
  providing a substrate wherein the high density structure is to be formed with a release liner, said release liner being self-removable;
  forming at least one cavity in the substrate through the release liner, said at least one cavity forming at least a part of the high density structure;
  at least partially filling the at least one cavity with a filler material;
  sintering the thus formed structure;
  removing the release liner from the substrate after the step of sintering, wherein an outer surface of a structure provided by the filler material in the at least one cavity is substantially flush with an outer surface of the substrate;
  providing a second release liner on the surface of the substrate;
  forming at least one further cavity in the substrate through the second release liner, said at least one further cavity forming a further part of the high density structure; and
  at least partially filling the at least one further cavity with a further filler material.

2. A method according to claim 1, wherein the release liner is removable using ablation.

3. A method according to claim 1, wherein the release liner is soluble.

4. A method according to claim 1, wherein the release liner is spin coated or laminated on the surface of the substrate.

5. A method according to claim 1, wherein the at least one cavity is used for embedding an electrically conductive structure and the at least one further cavity is used for embedding a further element of the high density structure, said further element being selected from a group of: an electronic component, an optical component, a fluidic component interconnection, and a magnetic structure.

6. A method according to claim 1, wherein squeegee processing is used for the step of at least partially filling the cavity with the filler material and/or for the step of at least partially filling the further cavity with the further filler material.

7. A method according to claim 1, wherein during the step of at least partially filling, the filler material and/or the further filler material are provided in excess for excessively filling the at least one cavity and/or the at least one further cavity.

8. A method according to claim 1, wherein a line width of the high density structure is in the order of 50 micrometer.

9. A method according to claim 1, wherein height of the at least one cavity and/or of the at least one further cavity is in the range of 20%-70% of the substrate's thickness.

10. A method according to claim 1, wherein thickness of the release liner is in the range of 1-40 micrometer.

11. A method according to claim 10, wherein thickness of the release liner is in the range of 3-10 micrometer.

12. A method according to claim 1, wherein the step of at least partially filling the at least one cavity and/or at least partially filling the at least one further cavity comprises:
  depositing a seed of a metal in the at least one cavity and/or the at least one further cavity; and electroless growing a metal layer in the at least one cavity and/or the at least one further cavity.

13. A method according to claim 1, wherein for the substrate a substrate comprising at least one pre-manufactured cavity is selected, the method comprising the steps of:
   providing the release liner in an area of the at least one pre-manufacture cavity for protecting thereof from being filled by the filler material; and
   embedding a device in the at least one pre-manufactured cavity after removing the release liner.

14. A method according to claim 1, wherein material squeegee processing is used for the step of at least partially filling the cavity with the filler material.

15. A method according to claim 1, wherein during the step of at least partially filling, the filler material is provided in excess for excessively filling the at least one cavity.

16. A method according to claim 1, wherein the step of at least partially filling the at least one cavity comprises:
   depositing a seed of a metal in the at least one cavity; and
   electroless growing a metal layer in the at least one cavity.

17. A method according to claim 1, wherein height of the at least one cavity and/or of the at least one further cavity is in the range of 20%-90% of the substrate's thickness.

\* \* \* \* \*